United States Patent [19]

Hammann, IV et al.

[11] Patent Number: 4,960,750

[45] Date of Patent: Oct. 2, 1990

[54] RECORDING SHEET HAVING IMPROVED COHESION AND ADHESION OF MICROCAPSULES

[75] Inventors: William A. Hammann, IV; Rong-Chang Liang, both of Centerville; Teresa M. Thomas, Springfield; Jesse Hipps, Sr., Miamisburg, all of Ohio

[73] Assignee: The Mead Corporation, Dayton, Ohio

[21] Appl. No.: 323,526

[22] Filed: Mar. 14, 1989

[51] Int. Cl.$^5$ .................. B41M 5/22; G03C 1/40; G03C 1/00
[52] U.S. Cl. .................. 503/214; 427/152; 430/138; 503/215; 503/216
[58] Field of Search ............ 430/138; 503/214, 215, 503/226, 200; 427/150–152

[56] References Cited

FOREIGN PATENT DOCUMENTS 62-176893  1/1986  Japan .................. 503/215

Primary Examiner—Bruce H. Hess
Attorney, Agent, or Firm—Thompson, Hine and Flory

[57] ABSTRACT

A recording sheet which comprises a substrate having a layer of a metal on the surface thereof and a layer of microcapsules, said microcapsules being bonded to one another by means of a crosslinking agent which has reactively interacted with reactive moieties on the surface of said microcapsules, to improve the adhesion of said microcapsule layer to said metal layer.

20 Claims, No Drawings

RECORDING SHEET HAVING IMPROVED COHESION AND ADHESION OF MICROCAPSULES

BACKGROUND OF THE INVENTION

1. FIELD OF INVENTION

The present invention relates to a recording sheet having a surface layer of microcapsules and more particularly to an imaging sheet employing a layer of photosensitive microcapsules wherein improved cohesion of the microcapsules to one another and to the substrate is provided.

2. DESCRIPTION OF PRIOR ART

Imaging systems employing photosensitive microcapsules are described in U.S. Pat. Nos. 4,399,209 and 4,440,846 to The Mead Corporation. While the adhesion problems addressed herein have arisen in transfer imaging systems of the type described in U.S. Pat. NO. 4,399,209, the modifications which are proposed are also applicable to the self-contained imaging systems of U.S. Pat. No. 4,440,846. Transfer systems, utilize a photosensitive sheet known as a donor sheet which is prepared by coating a layer of photohardenable microcapsules on a support. The donor sheet is image-wise exposed to actinic radiation, assembled with a developer sheet and passed through the nip between a pair of pressure rollers. Images are formed by exposure-controlled release of an image-forming agent contained with a photohardenable composition in the microcapsules. The image-forming agent is typically a substantially colorless color precursor which reacts with a developer to form a visible image.

A need has arisen for improved cohesion of the microcapsules to one another. A number of factors have contributed to this need. First, some of the binders which have previously been used, like polyvinyl alcohol (PVA), do not provide good adhesion under higher humidity conditions, e.g. 25° C., 85% RH. It has also been found that higher pressures and slower roller speeds may be desirable in rupturing microcapsules—this combination of forces increases the adhesion of the microcapsules to the pressure roll and causes delamination of the microcapsules when the donor sheet and the developer sheet are separated.

The microcapsules are also preferably coated on highly reflective metallic substrates which may have low adhesion for the microcapsules. A particularly preferred reflective substrate is a material such as an aluminized film. These films are extremely hydrophilic and do not bind a layer of microcapsules well especially under humid conditions.

Finally, in some processes, the donor sheet may be reversed and rewound between exposures to eliminate waste between successive images. As a result, portions of the donor sheet may be traversed by the pressure rollers as many as three times, thus further accentuating the need for better adhesion and cohesion of the layer of microcapsules.

The delamination problem is exacerbated in that the developer materials which are typically used are low molecular weight phenolic resins which are somewhat tacky. When the microcapsule sheet is exposed and assembled under pressure with a developer sheet coated with a phenolic resin to form the image, the microcapsules can be picked off the substrate. Attempts have been made to address microcapsule delamination in the prior art. Japanese KOKAI No. 62-176893 to Canon teaches a transfer recording medium comprised of a substrate and microcapsules disposed thereon, with the microcapsules or their coatings fixed to a surface material by means of a chemical reaction. Microcapsules are disposed on a polyethylene terephthalate film which is integrated with the wall material of the microcapsules by thermal polymerization, photopolymerization, condensation polymerization, crosslinking or the like. A substance which effects thermal polymerization or photopolymerization is included in the microcapsule walls and substrate or a surface coating and may include a thermal polymerization or photopolymerization initiator, a polymeric prepolymer, a polymeric oligomer and a crosslinking agent such as ethylene glycol diacrylate, propylene glycol diacrylate or 4-butanediol diacrylate.

SUMMARY OF THE INVENTION

The present invention is useful in overcoming microcapsule delamination in carbonless paper, heat-sensitive recording paper, and the like, but it is particularly directed to providing improved photosensitive materials of the type described in U.S. Pat. Nos. 4,399,209 4,440,846, 4,772,530 and 4,772,541 having improved cohesion and adhesion of the microcapsules. This objective is accomplished through the use of a molecular crosslinker.

It has been found that cohesion of the microcapsule layer can be improved through the use of a crosslinking agent which reactively bonds with reactive moieties in the binder or on the surface of the microcapsules. More particularly, it has been found that the aforementioned photosensitive materials, crosslinking improves reciprocity performance under high temperature and high humidity (e.g., 90% RH/35° C.). While not desiring to be bound, it is believed that crosslinking improves the oxygen barrier characteristics of the microcapsules.

In accordance with the present invention, a recording sheet is provided which comprises a substrate having a layer of a metal on the surface thereof, and a layer of microcapsules containing a crosslinking agent on the surface of said layer of said metal, said microcapsules having reactive moieties on the surface thereof or being contained in a binder having reactive moieties, said reactive moieties being bonded to said crosslinking agent to improve the cohesive strength of said layer of microcapsules.

In a preferred embodiment, the reaction between the crosslinking agent and the moieties on the surface of the microcapsules or in the binder is a pH dependent reaction which is controlled to permit one to formulate a composition which is readily coatable and in which the pH is adjusted after coating to cause the microcapsules to bond to one another via the crosslinking agent. In a specific embodiment a pH dependent ionic or acid-base complex is formed between the crosslinking agent, which is preferably an acid or basic polymer, and reactive moieties in the walls of the microcapsules. Still more particularly, the recording sheet is aluminized polyethylene terephthalate (hereafter AlPET,); the crosslinking agent is polyvinyl pyridine, poly(2-N,N-dimethylaminoethyl (meth)acrylate) or their copolymers; the reactive moieties are sulfonate groups which are provided by a sulfonated polystyrene emulsifier which is present within or on the surface of the microcapsule walls.

Definitions

Herein the term "metal" as used with respect to the substrate includes metal oxides as well as metals per se.

The term "acid" or basic polymer refers to polymers which can be protonated or deprotonated by pH adjustment to induce a cationic or anionic state.

DETAILED DESCRIPTION

As previously discussed, the present invention is particularly directed to providing improved photosensitive materials of the type described in U.S. Pat. Nos. 4,399,209; 4,440,846; 4,772,530 and 4,772,541 having improved cohesion of the microcapsule layer and improved adhesion of the microcapsule layer to a metallic substrate, and more particularly AlPET. Also as previously discussed, this objective is accomplished by improving the cohesion of the microcapsules by crosslinking the binder or the microcapsules to one another through the use of a molecular crosslinker.

Improved cohesion is preferably achieved through interaction of a crosslinker with reactive moieties on the surface of the microcapsules. These reactive moieties may be present in the material forming the microcapsule walls or in an emulsifier or protective colloid entrained in the walls.

Microcapsules useful in the present invention can be prepared by any of a number of conventional processes. They may be gelatin microcapsules, polyurea microcapsules, polyurethane microcapsules, urea-formaldehyde microcapsules, melamine-formaldehyde microcapsules, etc. The preferred microcapsules are melamine-formaldehyde microcapsules prepared using a combination of pectin and polystyrene sulfonate as an emulsifier. This method is described in U.S. application Ser. No. 128,292 filed Dec. 3, 1987 which is incorporated herein by reference. Also useful are microcapsules prepared using pectin and isobutylene maleic anhydride copolymer as emulsifiers as described in U.S. Pat. No. 4,608,330.

Examples of reactive moieties with which the crosslinker reacts to improve cohesion include hydroxyl groups, sulfonate groups, amino groups and carboxyl groups. Hydroxyl groups may be introduced to the microcapsule wall though the use of emulsifiers such as pectin, gum arabic, and PVA, or they are inherently present in microcapsules prepared from hydroxypropyl cellulose (hereinafter HPC) as described in U.S. Pat. No. 4,025,455.

Sulfonate groups may be introduced to the microcapsule wall through the use of emulsifiers such as sulfonated polystyrene, polyvinyl sulfonate, sodium or potassium sulfopropyl (meth)acrylate copolymers.

Carboxyl groups may be introduced through the use of emulsifiers or protective colloids such as pectin, gum arabic, casein, carboxymethylcellulose (hereinafter CMC), methacrylic and acrylic acid copolymers, or maleic anhydride copolymers such as styrene maleic anhydride copolymer and isobutylene maleic anhydride copolymer.

Amino groups are present in microcapsules prepared using casein and in certain polyurea microcapsules prepared by interfacial polymerization of a polyisocyanate and a polyamine.

Examples of binders having the aforementioned reactive moieties include polyvinyl alcohol, polyamines, polyacrylamide, 2-hydroxyethyl acrylate copolymers and phenolic resins.

In the present invention, improved cohesion is achieved by reacting the reactive moieties discussed above with a crosslinking agent. The crosslinking agent may form ionic or covalent bonds with reactive moieties in the microcapsules or in the binder. Any polyfunctional or polyvalent compound which is capable of interacting with the aforementioned moieties may be a useful crosslinking agent. Examples of useful crosslinking agents include polyvinylpyridine (PVPY), gelatin, sodium borax, zinc salts such as zinc chloride, chromium salts such as chromic acid, polyvinylbenzyl trimethylammonium chloride, melamine formaldehyde resins, and glyoxal. Borax, other metal borates, and metal salts readily form complexes between microcapsules containing hydroxyl groups in the wall, and also form crosslinks in binders containing hydroxyl, carboxyl and amino groups. Glyoxal will react with any of the reactive moieties discussed.

Compounds such as PVPY which can be protonated or deprotonated to form a pH dependent ionic complex or ionomer with microcapsules containing carboxyl groups or sulfonate groups are preferred. In order to achieve crosslinking it is necessary to bring the coating composition to a pH at which the crosslinker is essentially positively charged and the carboxyl or sulfonate groups are present as the free bases (e.g., COO— or SO$_3$—). By the same token, crosslinking can be prevented (to permit the composition to be coated without prematurely setting) by maintaining the composition at a pH at which the crosslinker is not charged or is negatively charged. Thus, to coat the microcapsules, a pH is selected which is greater than the isoelectric point of PVPY, such a pH may range from about 7.5 to 9.5. To set the microcapsules a pH less than the isoelectric point of PVPY and greater than the isoelectric point of pectin or sulfonated polystyrene is used; such a pH may range from about 4.5 to 6.5.

In accordance with a preferred embodiment of the invention, the pH adjustments necessary to cause or prevent crosslinking may be produced through the addition and evaporation of ammonia. In accordance with this embodiment of the invention, a microcapsule slurry is prepared. An acid such as phosphoric acid is added to lower the pH to approximately 4.5–6.5. The slurry is then treated with ammonia hydroxide to raise the pH to approximately 7.5–9.5 for coating. PVPY is added to the microcapsule slurry. At this point, under basic conditions, both the crosslinking agent and the reactive moieties of the microcapsules have a negative charge and no crosslinking occurs. The lack of crosslinking at this point permits the microcapsule slurry to maintain a fluid consistency which is easily coated onto the desired substrate.

After the microcapsule slurry has been coated onto the desired substrate, the ammonia is evaporated, and the coated microcapsule slurry enters the pH range in which the crosslinking agent exhibits a positive charge and the reactive moiety associated with the microcapsule exhibits a negative charge, and crosslinking occurs.

The crosslinker is generally employed in an amount of approximately 1 to 5% by weight, and preferably about 1 to 2% by weight solids based on the coating composition. As a general rule, good adhesion is achieved when the amount of crosslinker plus reactive moiety source (e.g., an emulsifier) is present in an amount of 2 to 4% by weight.

One reason that microcapsules exhibit poor adhesion to aluminized surfaces is that the aluminum oxidizes and forms a thin layer of aluminum oxide. This aluminum oxide layer is very hygroscopic and readily bonds a layer of water molecules when exposed to the air. This layer of water molecules prevents one from obtaining good adhesion of a coating, such as a coating of microcapsules, to the aluminized surface (while the discussion herein will refer to aluminum surfaces, similar or related problems occur in attempting to bond microcapsules to other metal surfaces).

The adhesive strength of the microcapsules to aluminized and other metal surfaces can be further improved through the use of a coating system containing an additive that has the ability to displace the water molecules bonded to the aluminized surface and which has a strong affinity for the microcapsules or the binder in which they are contained. This additive links the microcapsule layer and the aluminum oxide and thereby improves adhesion of the microcapsule layer to the aluminized surface. This additive is hereafter referred to as a "coupling agent". Particularly useful coupling agents for water-based coatings are silanes and titanium, zirconium and chromium coupling agents. Coupling agents can be mixed with the microcapsules directly or precoated on the substrate and overcoated with a layer of microcapsules.

Preferred coupling agents are polysiloxanes having the general formula (I):

where R' is a moiety which exhibits strong affinity for the microcapsule layer such as an alkyl group having 3 to 18 carbon atoms and additionally having functional groups selected from the group consisting of amino, hydroxyl, epoxidyl and acryloyl groups, or a polyphenol group having 1 to 10 phenolic moieties, and R is a short chain (C1-C6) alkyl group such as a methyl group.

The R' moiety is selected for compatibility with the microcapsules. Preferred moieties are alkyl groups have 3 to 6 carbon atoms with the above-mentioned functional group at the omega-position and polyphenols such as low molecular weight novolac, epoxidized novolac, low molecular weight melamine formaldehyde and alkoxy (e.g. propoxyethoxy) phenolic resins.

Another benefit of the siloxane is that not only does it displace water and anchor the microcapsule layer, but the silicon atoms bond with multiple aluminum atoms to create a stable surface configuration resistant to attack by moisture. Additionally, after complete substitution has taken place, no aluminum oxide sites remain available for formation of the undesirable water film.

In addition to silanes, other coupling agents include titanium couplers, chromium couplers and zirconium couplers such as zirconium [tetrakis(salicylidene)diamiobenzidium] complexes. Complexes such as this are very bulky and do not allow water to form a layer on the aluminized surface, although they may not form real covalent bonds with the surface as silanes will.

The coupling agents may be used alone or in combination with a binder such as polyvinyl alcohol or polyvinyl pyrrolidone. The coupling agent is preferably present in an amount of about 0.1 to 10 parts by weight per 100 parts of microcapsules. They may be used as a primer coating in a double layer coating process, or used as an additive in a single layer coating. In the former case less coupling agents are needed but the coating process is more complicated.

It has also been found that the adhesive strength of the microcapsules to aluminized and other metal surfaces is further improved through the use of a wet adhesion promoter. Examples of wet adhesion promoters include polyisocyanates, pyridine containing polymers including vinyl pyridine polymers and copolymers which are water soluble such as acrylate pyridine copolymers containing up to 5% pyridine. To make these polymers water soluble they must contain a water soluble monomer such as 2-hydroxyethyl (meth)acrylate. Another useful wet adhesion promoter is a water soluble compound of the formula (II)

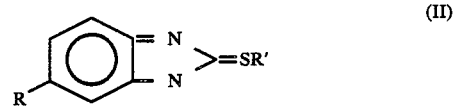

where R and R' are alkyl groups having 1 to 10 carbon atoms and R contains a water solubilizing moiety such as a hydroxyl, carboxyl or sulfonate group.

Examples of polyisocyanate wet adhesion promoters include hexamethylene diisocyanate, methylene diisocyanate, toluyldiisocyanate and others. These isocyanates are blocked in a conventional manner and heated after the substrate is coated with the microcapsule coating composition to liberate the isocyanate groups for reaction with the reactive moieties in the binder or microcapsules. The polyisocyanate forms hydrogen bonds with the metal substrate.

Pyridine containing polymers such as PvPy or compounds of the formula (II) also interact with the metal substrate through hydrogen bonding and react with reactive moieties in the binder or microcapsules to improve adhesion.

Other metal substrates useful in the present invention include tin and copper.

Thus, in one embodiment of the present invention, the crosslinking agent may be used alone. Optionally, in a second embodiment of the present invention the cross-linking agent may be used in conjunction with either a coupling agent or a wet adhesion promoter.

Methods for preparing microcapsules and photosensitive compositions preferred for use herein are described in U.S. Pat. No. 4,772,541. Preferred developers are described in U.S. application Ser. No. 073,030 filed July 14, 1987 and preferred methods for making microcapsules with sulfonated polystyrene and pectin are described in U.S. application Ser. No. 128,292 filed Dec. 3, 1987.

EXAMPLE

Melamine-formaldehyde microcapsules having reactive sulfonate groups were preprared in accordance with U.S. application Ser. No. 128,292 of Dec. 3, 1987 and a coating composition was prepared as follows:

| MF | Microcapsules |
| --- | --- |
|  | 95.7% |
| PVA | 3% |
| Triton X-100 | 1.2% |
| PVPY | 0.1% |

PVPY is dissolved in water and added with the PVA and Triton X-100 to the microcapsule coating solution. The PVPY is added in an amount such that the amount of pyridine is approximately equimolecular to the amount of sulfonate groups on the microcapsules. The pH is adjusted to 4.5 with 20% H₃PO₄ and then adjusted to 8.0 with 10% NH₄OH. The composition is coated on ALPET and dried, at 150° C. and 6g/m² in the coater at 100 ft/min, the pH is adjusted to 4-5 through evaporation of ammonia whereupon the pyridinyl groups react with the sulfonates.

Having described the invention in detail and by reference to preferred embodiments thereof, it will be apparent that modifications and variations are possible without departing from the scope of the invention defined in the appended claims.

What is claimed is:

1. A recording sheet which comprises a substrate having a layer of a, metal on the surface thereof and a layer of microcapsules containing an image-forming agent on the surface of said metal layer, said microcapsules having moieties on the surface thereof or being contained in a binder having moieties which are reactively bonded to a crosslinking agent to provide improved cohesion of said layer of microcapsules.

2. The recording sheet of claim 1, wherein said crosslinking agent reacts with said moieties to form a pH dependent ionic or acid-base complex.

3. The recording sheet of claim 1, wherein said layer of microcapsules is formed by, in sequence, preparing an admixture of a crosslinking agent and microcapsules coating said admixture on said substrate, and reacting said crosslinking agent with said reactive moieties.

4. The recording sheet of claim 3, wherein said admixture is essentially non-reactive at a first pH and essentially reactive at a second pH, and said step of reacting said crosslinking agent includes the step of adjusting said pH from said first pH to said second pH.

5. The recording sheet of claim 4, wherein said pH is adjusted by evaporation of ammonia.

6. The recording sheet of claim 5, wherein said coupling agent is a compound having at least one moiety which ionically or covalently bonds to said metal and another moiety which is compatible with said layer of microcapsules.

7. The recording sheet of claim 5, wherein said metal layer is aluminum, said crosslinking agent is polyvinyl pyridine, and said coupling agent is an organomethoxysilane.

8. The recording sheet of claim 1, wherein said reactive moieties are present in an emulsifier which is present within or on the surface of said microcapsules.

9. The recording sheet of claim 1, wherein said reactive moieties are selected from the group consisting of sulfonate, hydroxyl, amino, and carboxyl groups.

10. The recording sheet of claim 9, wherein said crosslinking agent is selected from the group consisting of sodium borax, polyvinyl pyridine, polyvinylbenzyl trimethyl ammonium chloride, gelatin, poly (2-N,N-dimethylaminooethyl (meth)acrylate) and copolymers of them.

11. The recording sheet of claim 10, wherein said reactive moieties are sulfonate groups.

12. The recording sheet of claim 11, wherein said crosslinking agent is polyvinyl pyridine or a vinyl pyridine copolymer.

13. The recording sheet of claim 1, wherein said microcapsule layer also contains a coupling agent.

14. The recording sheet of claim 13, wherein said metal is aluminum.

15. The recording sheet of claim 14, wherein said coupling agent is selected from the group consisting of titanium and silane coupling agents.

16. The recording sheet of claim 15, wherein said coupling agent is a silane.

17. The recording sheet of claim 16, wherein said silane is a compound of the general formula (I):

$$R' Si (OR)_3 \qquad (I)$$

where R' is a moiety which exhibits strong affinity for the microcapsule layer and additionally having functional groups selected from the group consisting of amino, hydroxyl, epoxidyl and acryloyl groups; or a polyphenol group having 1 to 10 phenolic moieties, and where R is a short chain (C1–C6) alkyl group.

18. The recording sheet of claim 17, wherein said silane is an organomethoxy silane.

19. The recording sheet of claim 13, wherein said coupling agent is used in an amount of about 0.1 to 10 parts by weight per 100 parts of microcapsules.

20. The recording sheet of claim 1 wherein said microcapsules are photosensitive.

* * * * *